United States Patent [19]

DeLuca

[11] Patent Number: 4,860,348
[45] Date of Patent: Aug. 22, 1989

[54] MODULAR JACK PANEL CONSTRUCTION

[75] Inventor: Paul V. DeLuca, Plandome Manor, N.Y.

[73] Assignee: Porta Systems Corp., Syosset, N.Y.

[21] Appl. No.: 230,876

[22] Filed: Aug. 11, 1988

[51] Int. Cl.[4] .............................................. H01R 9/24
[52] U.S. Cl. ................................... 379/327; 379/330; 361/426
[58] Field of Search ............... 379/327, 328, 329, 326, 379/330; 361/426; 439/131, 142

[56] References Cited

U.S. PATENT DOCUMENTS

| | | | |
|---|---|---|---|
| 3,852,703 | 12/1974 | Carney et al. | 379/329 X |
| 4,763,226 | 8/1988 | Pellertier | 379/329 X |

Primary Examiner—James L. Dwyer
Attorney, Agent, or Firm—Charles E. Temko

[57] ABSTRACT

A telephone jack panel assembly suitable for modular digital installations which facilitates connection at a period of time when the frame upon which it is installed is already congested by previously installed connectors. As contrasted with conventional construction, the disclosed panel is provided with a rearwardly extending housing, which mounts plural multi-contact connectors which are interconnected to corresponding multi-contact jacks mounted upon the free ends of incoming telephone cables. Thus, only a relatively few plug connections need be made without the necessity of removing the jack from the main frame. The housings for each jack panel are so contoured as to form a horizontally oriented recess, one for each jack panel, when a plurality of such jack panels are assembled on the main frame in stacked relation.

2 Claims, 2 Drawing Sheets

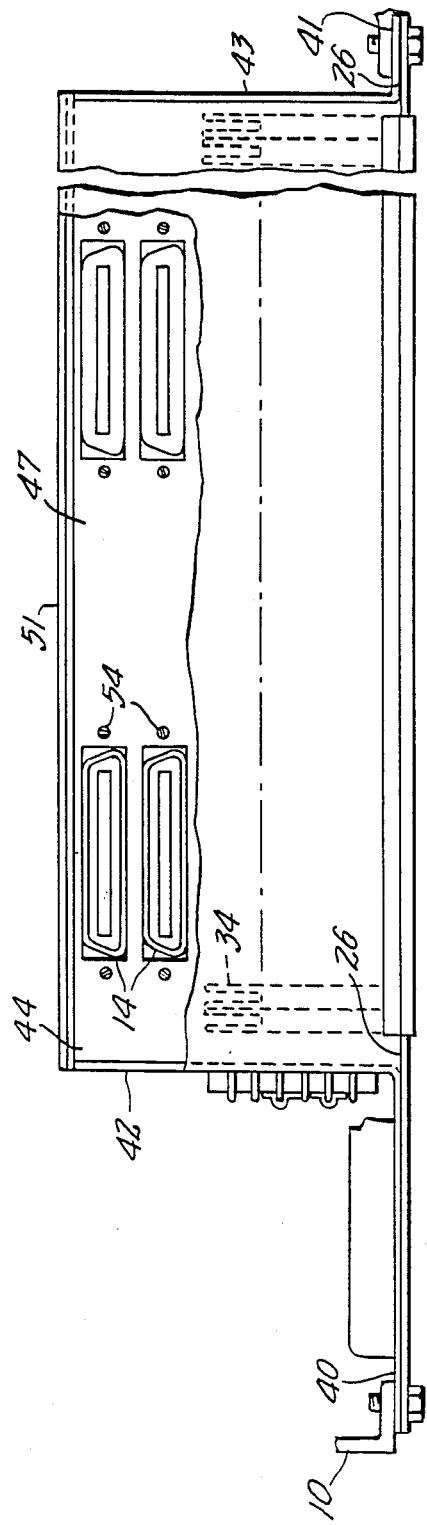
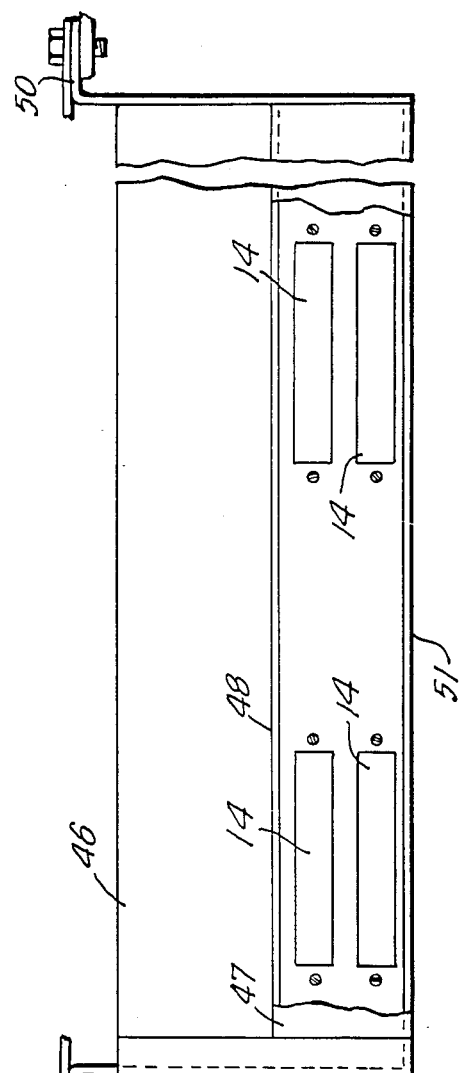
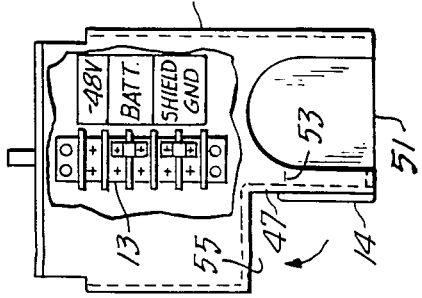

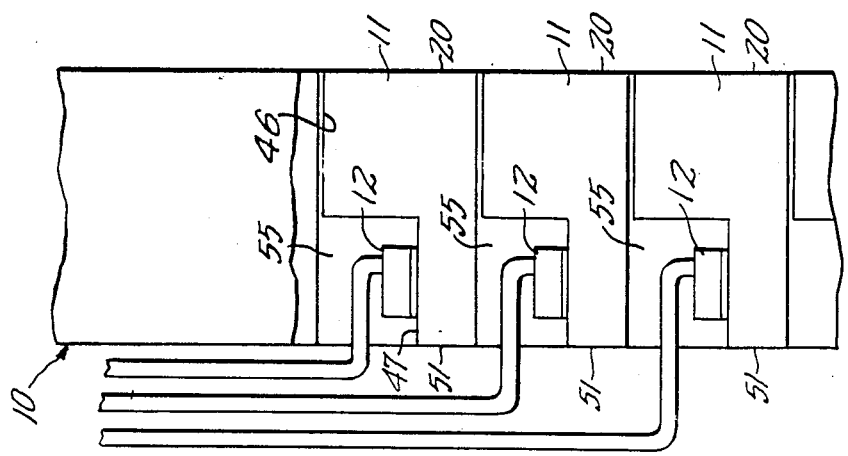
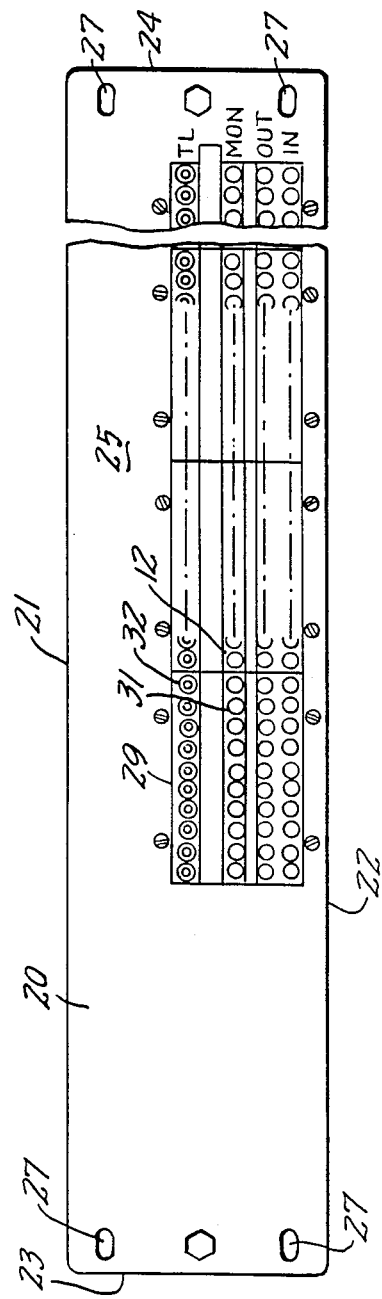

MODULAR JACK PANEL CONSTRUCTION

BACKGROUND OF THE INVENTION

This invention relates generally to the field of telephony, and more particularly to an improved jack panel construction normally mounted upon a telephone mainframe in a central office. Devices of this general type are known in the art, and the invention lies in specific constructional details which provide increased convenience in installation and the making of connections.

The use of jack panels which are mounted upon mainframes in a telephone central office provides a convenient means for making manual cross-connections, thus affording a degree of flexibility within the central office which is not otherwise available.

After installation of a plurality of jack panels upon a mainframe, the usual practice is to wire the panels to incoming cabled circuitry starting at a medially disposed level on the frame, and as the subscriber circuit density increases, jack panels are connected in serial fashion in either an upward or downward direction upon the frame. While such wiring is not normally particularly complicated when the first few panels are interconnected, as more wiring appears at the rear of the mainframe behind the jack panels, difficulty increases, not only in terms of accessibility, but in terms of sheer bookkeeping on the part of the craftsperson performing the installation to prevent improper wiring of the circuits.

SUMMARY OF THE INVENTION

Briefly stated, the invention contemplates the provision of an improved jack panel construction having provision for connectorized interconnection of recently added circuitry with a substantial reduction of difficulty on the part of the craftperson. To this end, the individual jack panel housings are configured in such manner that connectorized multi-contact jacks are positioned in a horizontally oriented recess at the rear of the panel assembly, and laterally positioned with respect to the normal cabling plane of the mainframe. When cabling interconnections with a newly activated jack panel are required, it is necessary to lower the connectorized end of the added cable in the cabling plane of the frame to interconnect with the mating plug disposed within the recess at the rear end of the jack panel, which plug will normally be facing upward. Once engaged, the connectorized elements are within the recess and laterally positioned from the cable plane, so as not to interfere with the making of subsequent connections.

BRIEF DESCRIPTION OF THE DRAWING

In the drawing, to which reference will be made in the specification, similar reference characters have been employed to designate corresponding parts throughout the several views.

FIG. 1 is a top plan view of an embodiment of the invention in stacked relation with similar devices and partly broken away to show detail.

FIG. 2 is a bottom plan view thereof, partly broken away to show detail.

FIG. 3 is an end elevational view thereof.

FIG. 4 is a front elevational view thereof.

FIG. 5 is a side elevational view showing plural devices in installed condition upon a telephone mainframe.

DETAILED DESCRIPTION OF THE DISCLOSED EMBODIMENT

In accordance with the invention, have initial lower-case letters 10 designates a known telephone mainframe mounting a plurality of individual jack panel housing elements 11 in vertically stacked relation. Each of said jack panel elements mounts a plurality of known plug connectors 12, a plurality of known non-circuit terminals 13, and a plurality of multi-circuit cable connectors 14.

Each of the housings 11 includes a planar front panel 20 bounded by an upper edge 21, a lower edge 22, as well as first and second side edges 23 and 24. Extending from a front surface 25 to a rear surface 26 are aligned mounting holes 27 securing the same to the mainframe 10. Also extending between the front and rear surfaces is an elongated opening 29 which mounts an assembly of receptacles 12. This structure is conventional, including upper openings 32 mounting light-emitting diodes or similar indicators disposed above the plug openings 31, the rear ends 34 of the connectors 12 electrically communicating with the connectors 14 through conductors (not shown) in known manner. The non-circuit connectors 13 are also conventional and provide for battery connection, battery ground and shield grounds as is known in the art.

The enclosure portion of the housing elements 11 are positioned behind the front panels 20 and include mounting flanges 40 and 41, side walls 42 and 43 defining a rear opening 44, a bottom wall 45 and first and second upper walls 46 and 47 interconnected by a vertical wall 48. End walls 49 and 50 and a rear wall 51 complete the enclosure. The rear wall 51 is substantially less in area than said forward wall. The second upper wall 47 is provided with elongated openings 53 by means of which the connectors 14 are positioned by retaining screws 54, whereby they face upwardly within a horizontally extending recess 55. Referring to FIG. 5, a plurality of housing elements 11 are assembled upon a mainframe in vertically stacked relation. In this relation, the recesses 55 are accessible to a cabling plane extending vertically behind the housing elements, so that cabling may extend downwardly within the cabling plane of the mainframe to the proper level, to be engaged within the recess 55 with the connectors 14 through the corresponding jacks 60. In this manner, once the connection has been obtained, it is laterally disposed with respect to the cabling plane, and thus creates no interference with cables which are subsequently interconnected to other jack panel housings.

It may thus be seen that I have invented novel and highly useful improvements in jack panel construction, the use of which permits facilitated interconnection of new circuitry with jack panels which have been installed on a mainframe, but which have not been previously used. Substantially all individual wiring in interconnections have been eliminated. By prewiring the individual jack panel housings, the additional cables to be interconnected can be provided with corresponding plugs prior to insertion into the cabling plane, and the interconnection of the plugs and jacks permits simultaneous interconnection of a large number of new circuits.

I wish it to be understood that I do not consider the invention to be limited to the precise details of structure shown and set forth in this specification, for obvious modifications will occur to those skilled in the art to which the invention pertains.

I claim:

1. A telephone modulator jack panel construction comprising:

a unitary housing including a forward wall, a rear wall, a bottom wall, and first and second upper walls disposed in offset parallel relation, a vertical wall interconnecting said first and second upper walls to form a recess of generally rectangular cross-section when said housing is arranged in stacked vertical relation upon a mainframe; said rear wall being substantially smaller area than said forward wall and extending from said bottom wall to said second upper wall; a plurality of multi-contact plug elements mounted upon said second upper wall and facing said recess; and a plurality of jack-receiving plug elements having exposed open ends projecting through corresponding openings on said forward wall, and having rear ends electrically communicating with said multi-contact plug elements.

2. In combination, a plurality of telephone modular jack panels mounted upon a telephone mainframe in vertically stacked orientation, each of said jack panels including a unitary housing having a forward wall, a bottom wall, first and second upper walls disposed in offset parallel relation, and a vertical wall interconnecting said first and second upper walls, to form a horizontally extending recess in each of said jack panels; each of said jack panels including a plurality of multi-contact plug elements mounted upon said second upper wall and facing into a respective recess; each of said jack panels including a plurality of jack-receiving plug elements having exposed open ends projecting through corresponding openings in said forward wall thereof, and having rear ends electrically communicating with respective multi-contact plug elements.

* * * * *